United States Patent
Mouli

(10) Patent No.: US 6,548,372 B1
(45) Date of Patent: Apr. 15, 2003

(54) FORMING SIDEWALL OXIDE LAYERS FOR TRENCH ISOLATION

(75) Inventor: Chandra V. Mouli, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 79 days.

(21) Appl. No.: 09/685,531

(22) Filed: Oct. 10, 2000

Related U.S. Application Data

(62) Division of application No. 09/379,092, filed on Aug. 23, 1999.

(51) Int. Cl.$^7$ .................. H01L 21/336; H01L 21/76
(52) U.S. Cl. .................. 438/424; 438/296; 438/437; 438/440
(58) Field of Search .................. 438/424, 296, 438/440, 437

(56) References Cited

U.S. PATENT DOCUMENTS

| | | | | |
|---|---|---|---|---|
| 5,904,538 A | * | 5/1999 | Son et al. .................. | 438/424 |
| 6,063,694 A | * | 5/2000 | Togo .......................... | 438/400 |

\* cited by examiner

*Primary Examiner*—John F. Niebling
*Assistant Examiner*—Ron Pompey
(74) *Attorney, Agent, or Firm*—Trop, Pruner & Hu, P.C.

(57) ABSTRACT

A shallow trench isolated integrated circuit may be formed by creating an oxidation enhancing region at the corner between a semiconductor structure surface and the trench. This region may be formed by ion implantation or solid source diffusion in a way which decreases crystallographic defects. As a result, oxidation at the trench may be enhanced without adverse effects on leakage currents. In some embodiments, the impurity laden region is formed first and the trench is etched through the region leaving an impurity laden remnant at the corner between the trench and the structure surface.

1 Claim, 2 Drawing Sheets

FORMING SIDEWALL OXIDE LAYERS FOR TRENCH ISOLATION

This is a divisional of prior application Ser. No. 09/379,092 filed Aug. 23, 1999.

BACKGROUND

This invention relates generally to forming shallow trench isolation structures in making semiconductor devices.

Particularly in advanced processes, shallow trench isolation (STI) has significant advantages over local oxidation of silicon (LOCOS) in terms of scalability. Compared to LOCOS, STI reduces oxide encroachment into the active area and hence facilitates achieving compact cell designs. However, the STI process is known to increase leakage currents which affect performance. One application of STI processes is making dynamic random access memory (DRAM) devices.

The stress created in the top and bottom corners of the trench sidewall used in STI processes is one source of leakage current. The STI process usually involves an anisotrophic etch into the silicon surface. A sidewall oxidation step grows oxide on the sidewalls of the trench. The trench sidewall contains several possible crystallographic orientations and the interface trap density is higher in the sidewall than on the silicon surface. The sidewall oxide is designed to smooth this interface and to reduce the stress in the silicon.

The oxidation rate in stressed silicon is low. Thus, the thickness of the sidewall oxide at the corner between the silicon surface and trench may be reduced. To overcome this problem, oxidation is done at a high temperature to increase the oxide thickness. However, increasing the thermal budget is generally undesirable. For example, increasing the temperature increases the depth of all the existing junctions. In advanced semiconductor processes with extremely small geometries, this is a disadvantage.

One potential solution to the problem of thin sidewall oxides at the corner between the upper surface and the trench is to create crystallographic damage at this point. It is known that such damage increases the oxidation rate. Therefore, by creating a highly damaged region at the corner, the thickness of the sidewall oxide may increase.

However, creating damage in the silicon substrate at exactly the position where stresses are known to occur may be counterproductive. In fact, the net effect of creating such damage may be to increase the possibility of leakage currents. The implant damage creates a compressive stress. As a result, crystallographic defects may create leakage causing interface states. The generation and recombination centers increase as a result of increased crystallographic defects. The use of high energy implants to create damage creates nucleation sites which create defects which may also result in increased leakage currents.

Thus, there is a continuing need for a way of producing high quality sidewall oxides without unnecessarily creating silicon damage that may result in increased leakage currents.

SUMMARY

In accordance with one aspect of the present invention, a method of forming a trench isolation includes injecting impurities into a region in the semiconductor structure. A trench is made through the impurity laden region leaving a portion of the impurity laden region around the trench.

Other aspects are set forth in the accompanying detailed description and claims.

DETAILED DESCRIPTION

Figure 1:
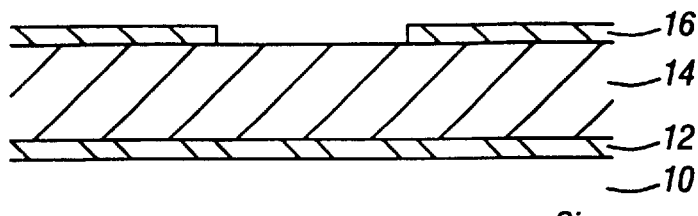
FIGS. 1–6 are greatly enlarged, partial cross-sectional views showing steps used in one embodiment of the present.

Referring to FIG. 1, a conventional semiconductor layer 10 may be used as the semiconductor structure for forming integrated circuit devices with shallow trench isolation (STI). For example, the layer 10 may be bulk silicon or it may be an epitaxial layer formed over a bulk silicon layer. A dielectric layer 12, commonly called a pad oxide, may be formed over the structure 10. The layer 12 may be formed using any conventional technique including thermal oxidation or deposition. For example, the layer 12 may be formed by chemical vapor deposition (CVD) or by the decomposition of tetraethyl orthosilicate (TEOS). In accordance with conventional silicon trench isolation processes, a nitride layer 14 may be formed over the layer 12. Conventionally, the nitride layer 14 is formed by chemical vapor deposition.

An anti-reflective coating 16 may be patterned on top of the nitride layer 14. The anti-reflective coating 16 may be used in advanced lithographic processes to define a pattern for etching through the layers 12 and 14. However, other patterned mask layers may be used, such as those using photoresist.

Figure 2:
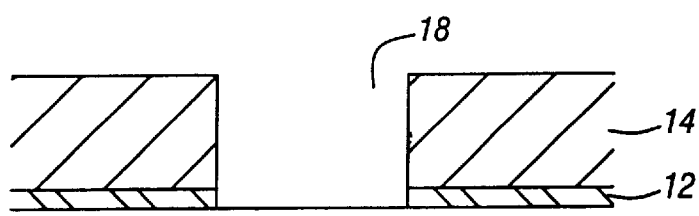

Referring next to FIG. 2, an anisotropic etching process may be used to form an opening 18 through the nitride layer 14 and the dielectric layer 12 down to the surface of the layer 10. Thereafter, the surface of the layer 10 may be cleaned if desired.

Next, a solid diffusion source 20 may be deposited into the opening 18. Suitable solid diffusion sources include borophosphosilicate glass (BPSG) materials doped with an oxidation enhancing species such as argon, or other inert species or oxygen. The source 20 allows impurities in the source to diffuse into the layer 10 when exposed to modest temperatures. As a result of the diffusion, the impurities form a diffused region 22 defined by the masking action of the opening 18. A typical solid source diffusion step may involve 800° C. for about twenty minutes.

Through the use of a solid diffusion source, an impurity laden region 22 containing oxidation enhancing impurities may be formed in the layer 10. The region 22 need not unnecessarily create interface states, generation and recombination centers, or other damage effects which may adversely effect the performance of the resulting STI.

Figure 3:
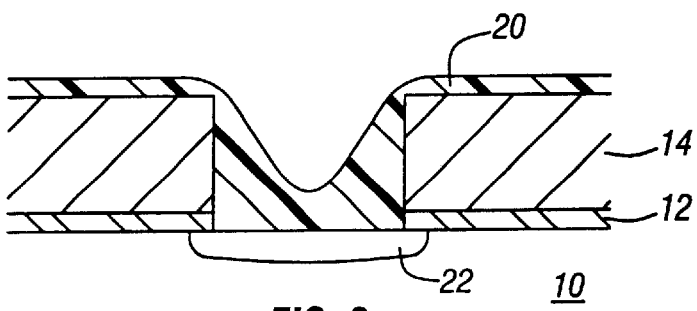
Figure 4:
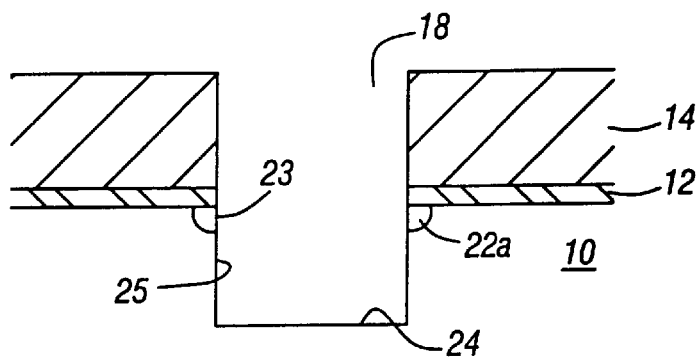

As illustrated in FIG. 4, an anisotropic etch forms a trench 24, which may have substantially vertical sidewalls 25. The anisotrophic etch is masked by the layers 12 and 14, which also act as the mask for the solid source diffusion. Thus, the trench 24 extends through the oxidation enhancing impurity region 22 leaving the portion 22a around the trench 24. The portion 22a corresponds to the underdiffusion which necessarily results in the course of the solid source diffusion process illustrated in FIG. 3.

The amount of underdiffusion and thus the lateral and vertical extent of the region 22a is a function of the concentration of impurities in the source 20 and the time and temperature of the diffusion step. As a result of the fact that the same mask is used for the etch and the diffusion, the region 22a is situated precisely at the corner 23 between the upper surface of the structure 10 and the trench 24. This is precisely the region which may be prone to thin oxide thicknesses, which, in turn, may give rise to leakage currents.

Figure 5:
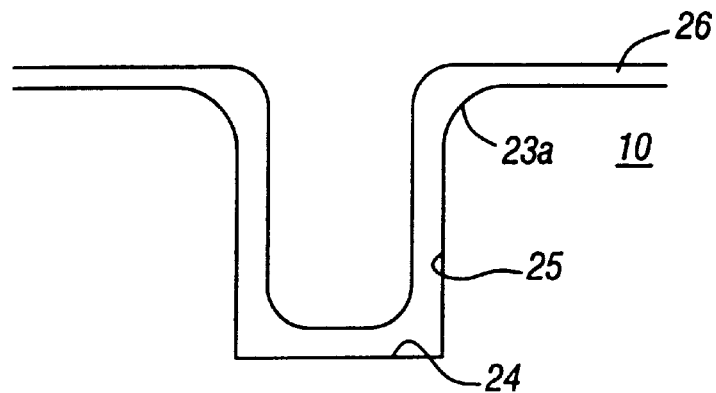

Turning next to FIG. 5, a sidewall oxidation process forms the sidewall oxide 26. Because of the oxidation enhancing affect of the impurities in the region 22a, the thickness of the sidewall oxide 26 at the corner is increased and the corners 23a are substantially rounded as a result of the oxidation process, improving the performance of the sidewall oxide 26.

Figure 6:
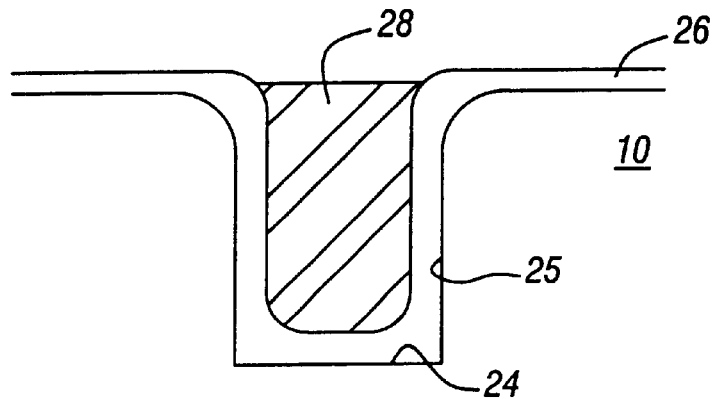

Finally, referring to FIG. 6, a trench filler material 28, such as a deposited oxide, may fill the trench lined by the sidewall oxide 26. By using high pressure deposition techniques, the trench 24 may be readily filled despite the fact that the trench 24 has relatively vertical sidewalls 25. By making the sidewalls 25 relatively vertical, the possibility of etching away the region 22a during the trench etching step is reduced.

Figure 7:
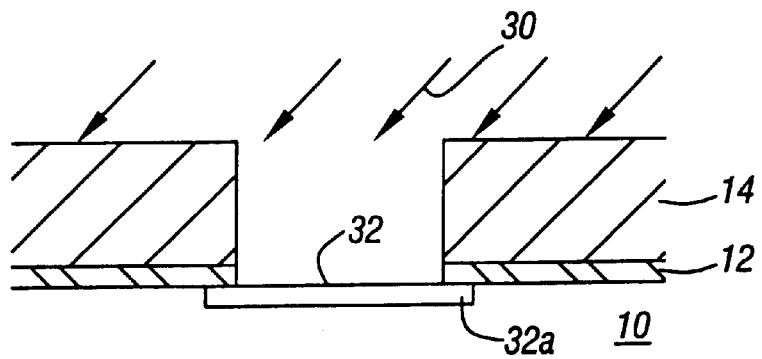
FIG. 7 is greatly enlarged, partial cross-sectional view in accordance with another embodiment of the present invention.

An alternate embodiment of the present invention, shown in FIG. 7, uses ion implantation to form the region 32a which corresponds to the region 22a in the embodiment of FIG. 4. After the step illustrated in FIG. 2, the resulting structure is exposed to an ion implantation 30. The implant species is preferably a species which enhances oxidation. Suitable species include argon, other inert elements and oxygen. Inert species are desirable because they do not contribute carriers to the semiconductor structure.

The implant acts to enhance oxidation rather than to create crystallographic damage which could cause leakage currents. As a result of lateral straggle, a portion 32a of the implanted region extends under the masking layers 12 and 14. The extent of lateral straggle (species movement transverse to the implant direction) is a function of the dose and implant energy. Generally, about 20 percent of implanted species are subject to lateral straggle.

In some embodiments of the present invention, it may be desirable to use an angled implant to produce the region 32a. By using an angled implant and rotating the layer 10, additional impurities may be caused to enter the region 32a. Of course, it should be understood that the height of the structure produced by the layers 12 and 14 is substantially less than what is depicted in the enlarged drawing of FIG. 7 and therefore the effect of the angled implant may be more substantial than it would appear from FIG. 7. Implant angles as high as 30° may be used in some embodiments. However, even where an angled implant is used, since the regions 32a are shielded below an implant mask they are primarily formed by lateral straggling.

To minimize the amount of crystallographic damage that results from the implant, it is desirable to use a relatively low energy implantation. For example, implantation energies of less than 20 keV are generally desirable and in some embodiments implantation energies of less than 10 keV may be used.

It is known that argon has an effect in enhancing oxidation which is not the result of damage to the silicon substrate. See Semiconductor International, Vol. 22, No. 2, February 1999. It is believed, without limiting the present invention, that the presence of argon makes it easier for oxygen to form oxygen-to-silicon bonds. It is believed that this is due to the fact that the silicon to silicon bond energy is higher than the argon to silicon bond energy so that the argon is more easily replaced if the argon is positioned substitutionally within the lattice. With interstitial argon species, the wave functions of silicon and argon are believed to interact to relax the bond strength.

Again, without limiting the present invention, it is believed that oxygen implants may similarly improve oxidation in a way which is not dependant on crystallographic damage effects. Oxidation is limited by the diffusion of oxygen into silicon and the diffusion of oxygen through any overlying oxidation layers. By implanting the oxygen under the surface of the silicon, it is believed that oxidation may be enhanced by the presence of the oxygen in the silicon structure, separate and apart from any damage created by the implant.

While a passivation layer may be utilized over the semiconductor layer 10 for the implantation, it may be advantageous in some embodiments to dispense with a passivation layer. This is because the use of a passivation layer may necessitate higher implant energies.

Because of the low implant energies that may be used, high doses may be used in some embodiments. For example, argon may be implanted at doses of approximately $1 \times 10^{15}$ atoms per square centimeter. In some embodiments, it may be desirable to use a relatively low temperature, short duration heat step to repair any damage which may result from the low energy implants. It is not believed that it is necessary for the argon species to be substitutional to have the oxidation enhancing effect.

After the implanted region 32 has been formed, the ensuing process steps follow the steps illustrated in FIGS. 4–6 and described previously. Namely, a trench 24 is formed through the implanted region 32 leaving the regions 32a, formed at least in part by lateral straggle, to either side of the trench. Thereafter, a sidewall oxide 26 is formed creating the round corners 23a. Finally, as shown in FIG. 6, the trench is filled with the trench filler material 28.

Thus, in accordance with embodiments of the present invention, an oxidation enhancing material may be positioned precisely at the corner where reduced oxidation normally occurs. As a result, in some embodiments, oxidation may be enhanced without significantly increasing the thermal budget for the process. In some embodiments, oxidation may be enhanced while actually reducing the thermal budget by reducing the temperatures or the times of high temperature steps commonly used in the sidewall oxidation step to overcome the reduced oxidation at the corner. At the same time, it is possible to decrease the disruption of the crystallographic structure at the corner region which would otherwise give rise to the possibility of crystallographic damage, interface states, generation and recombination centers and other defects which may produce leakage currents.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A semiconductor structure comprising:

a trench formed in said semiconductor structure extending through the surface of said semiconductor structure, said trench having a bottom and a sidewall, said sidewall having an upper edge and a lower edge adjacent said bottom; and a region containing oxidation enhancing impurities along the upper edge of said sidewall of said trench, said oxidation enhancing impurities including argon, the remainder of said sidewall of said trench being substantially free of oxidation enhancing impurities, said region exhibiting a degree of implant damage less than that associated with an implant of argon at 10 keV and a dosage of approximately $1 \times 10^{15}$ atoms per square centimeter.

* * * * *